United States Patent [19]

Cassany et al.

[11] Patent Number: 4,743,863

[45] Date of Patent: May 10, 1988

[54] DEVICE TO INCREASE THE DYNAMIC RATIO OF AN AMPLIFIER CIRCUIT, ESPECIALLY THAT OF AN ON-BOARD MLS RECEIVER

[75] Inventors: Jean L. Cassany, Chaville; Jean P. Margala, Maurepas, both of France

[73] Assignee: LMT Radio Professionnelle, Boulogne Billancourt, France

[21] Appl. No.: 880,742

[22] Filed: Jul. 1, 1986

[30] Foreign Application Priority Data

Jul. 4, 1985 [FR] France ................. 85 10200

[51] Int. Cl.$^4$ ............................................. H03G 3/10
[52] U.S. Cl. ..................................... 330/284; 330/280
[58] Field of Search ..................... 330/278, 284, 280

[56] References Cited

U.S. PATENT DOCUMENTS 4,646,036 2/1984 Brown ........................... 330/284

FOREIGN PATENT DOCUMENTS 2521387 10/1976 Fed. Rep. of Germany ...... 330/284
2937816 10/1980 Fed. Rep. of Germany .
2204333 5/1974 France .

Primary Examiner—Gene Wan
Attorney, Agent, or Firm—Oblon, Fisher, Spivak, McClelland & Maier

[57] ABSTRACT

To increase the dynamic ratio of an amplifier, it is preceded by a switchable attenuator which is switched on when the output voltage of the amplifier exceeds a threshold, this output voltage being added to a shifting voltage.

5 Claims, 3 Drawing Sheets

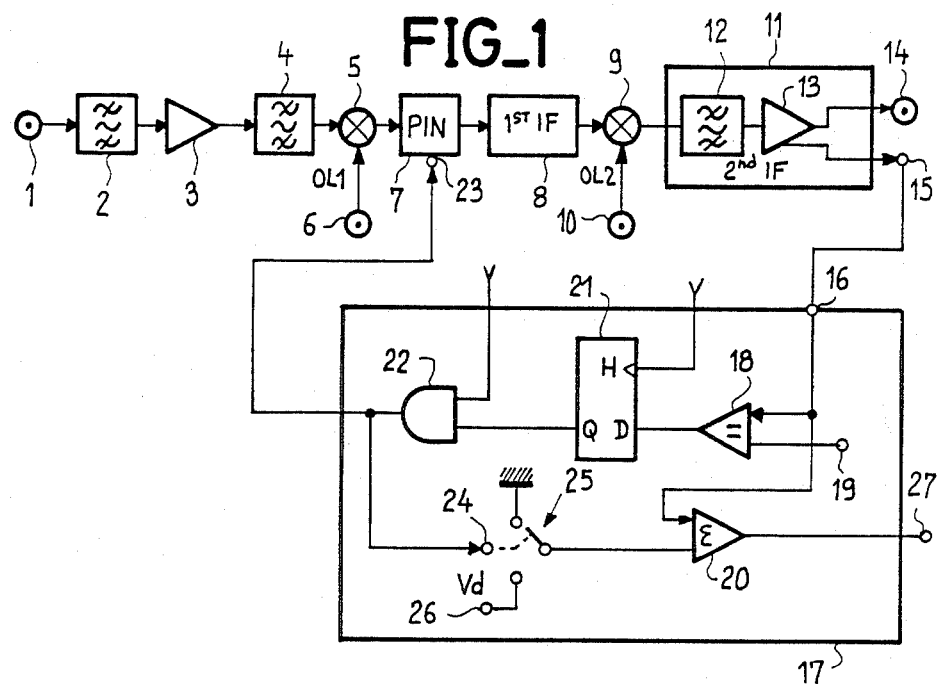
FIG_1
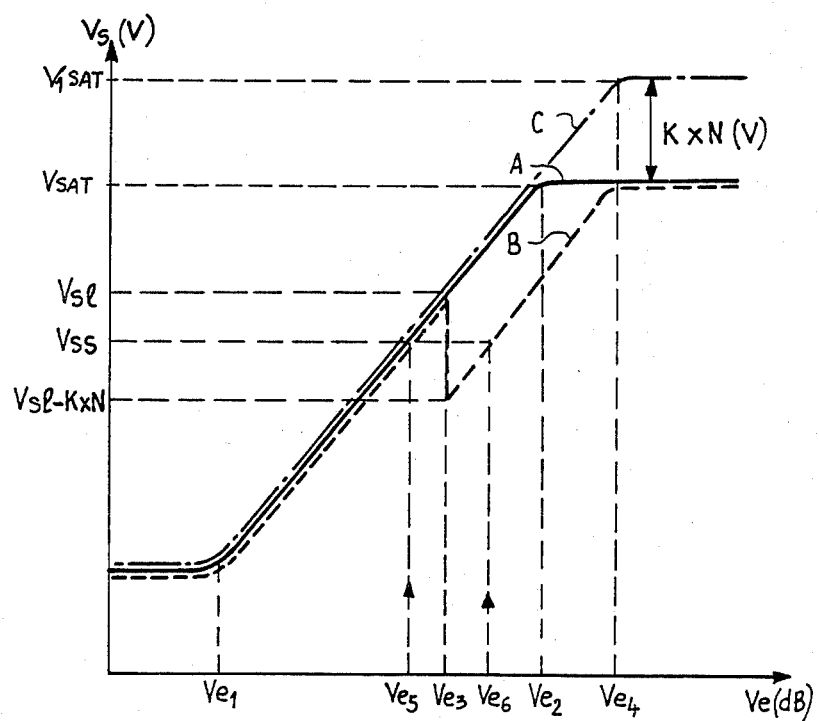
FIG_2

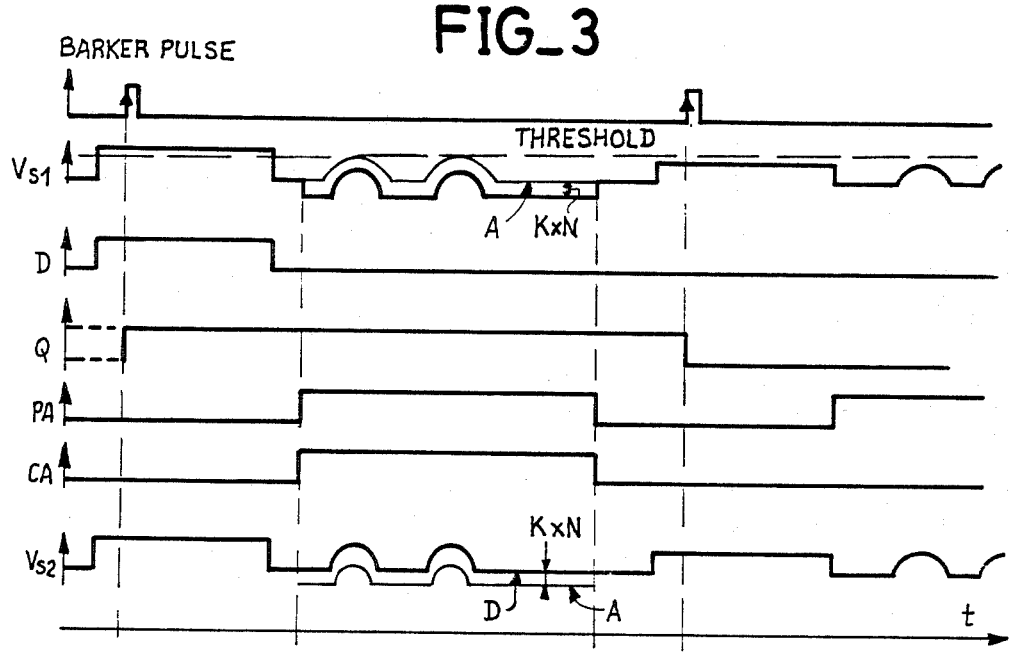
FIG_3
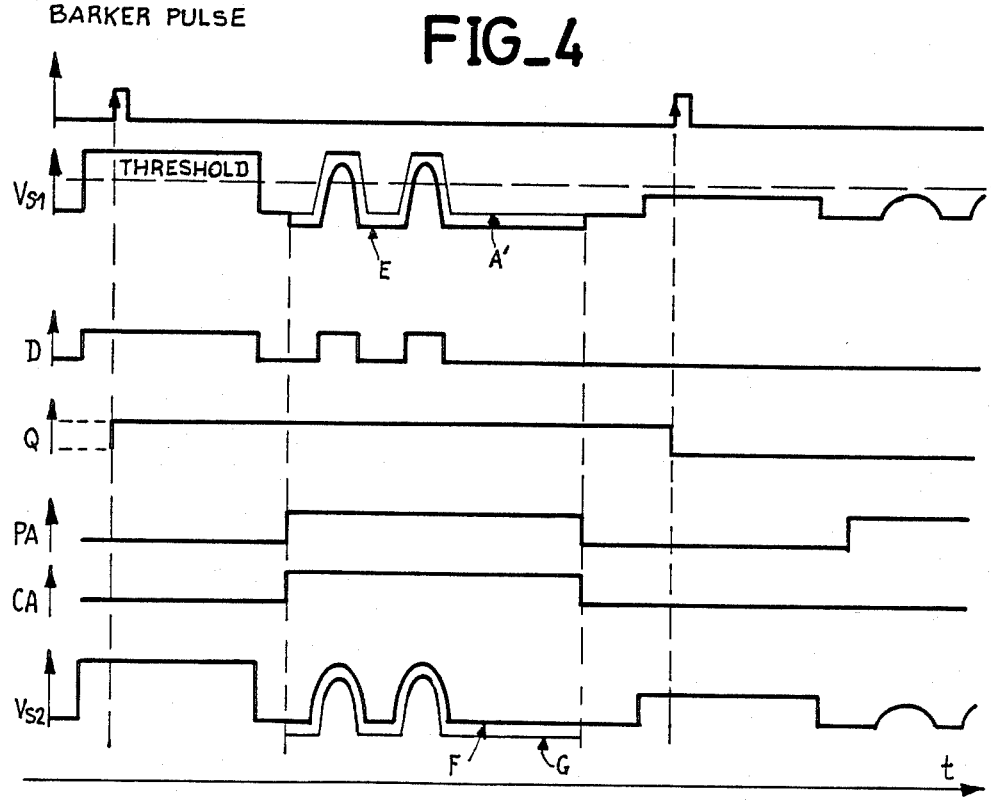
FIG_4

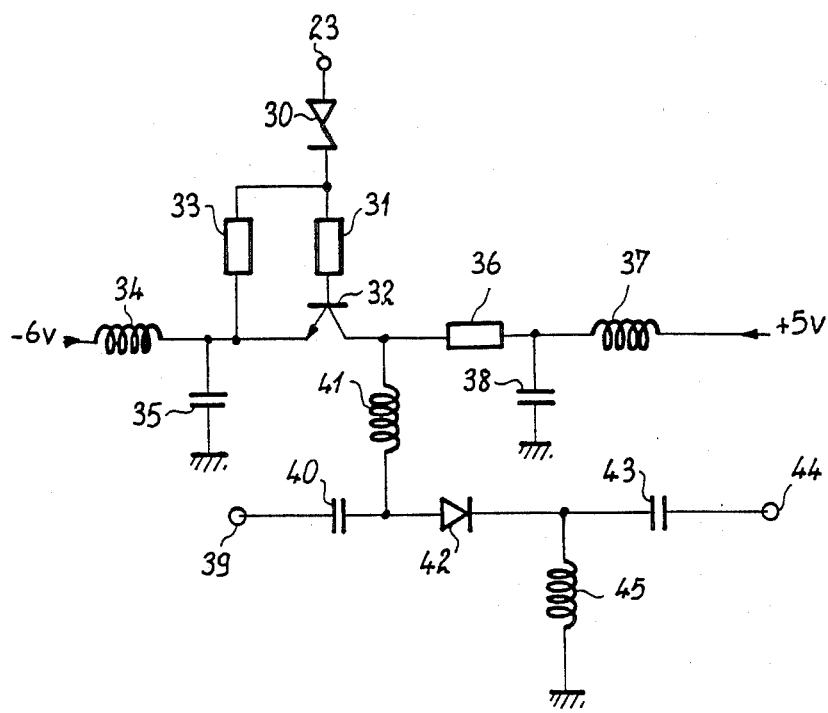
FIG_5

DEVICE TO INCREASE THE DYNAMIC RATIO OF AN AMPLIFIER CIRCUIT, ESPECIALLY THAT OF AN ON-BOARD MLS RECEIVER

BACKGROUND OF THE INVENTION

Field of the Invention

The present invention relates to a device to increase the dynamic ratio of an amplifier circuit, especially that of an on-board MLS receiver.

The MLS (microwave landing system) uses a signal which has the format of a pulse-time multiplexed signal. This multiplexed signal may consist, in particular, of data relating to the rear azimuth, elevation and flattening-out angles as well as auxiliary data. These different functions are transmitted by different antenna, and this fact can give rise to sharp variations in level between one function and another.

In order that the on-board receiver which has to receive the MLS signal may function properly in the face of these variations in the level of the signal, it has been sought to use a linear amplifier fitted with an automatic gain control system, but this solution has proved to be difficult to use because the different functions of the MLS are transmitted at a pseudo-random rate. It has also been sought to use a logarithmic amplifier, but the dynamic ratio of such an amplifier is far too limited for this application. This fact entails the risk that the amplifier might be saturated in the presence of high-level signals, a phenomenon that does not affect the preamble, which is phase-modulated, but affects the angle signals which are transmitted by amplitude modulation.

The object of the present invention is a device by which it is possible, in a simple and economical way, to increase the dynamic ratio of a receiver, especially an on-board receiver for an MLS system.

SUMMARY OF THE INVENTION

The device according to the invention comprises a switchable attenuator upstream of the amplifier circuit, the dynamic ratio of which is sought to be increased. This attenuator is switched on above a determined threshold of the signal received and the output signal of the amplifier circuit is added, in a corrective network and for the time during which the attenuator is switched on, to a shifting voltage which is equal, in terms of absolute value, to the product of the amplifier circuit slope and the attenuation provided by the attenuator. The attenuator is preferably of the very fast-response type such as a PIN diode attenuator.

BRIEF DESCRIPTION OF THE DRAWINGS

The present invention will be better understood from a detailed description of an embodiment taken as a non-exhaustive example and illustrated by the appended drawing wherein:

FIG. 1 is a block diagram of a receiver according to the invention;

FIG. 2 is a set of curves of responses that are characteristic of the device of the invention FIGS. 3 and 4 are timing diagrams that explain the functioning of the device according to the invention, and FIG. 5 is an example of an embodiment of the attenuator controlled by the receiver of FIG. 1.

DESCRIPTION OF THE PREFERRED EMBODIMENT

The device of the invention for increasing the dynamic ratio is described below with reference to an on-board MLS receiver, but it is understood that this device is not restricted to this application alone, and that it may be used in numerous instances where it is desirable to prevent the saturation of an amplifier that receives signals with a very wide dynamic ratio.

FIG. 1 shows the input part of an on-board receiver for an MLS system, fitted with a device according to the invention.

The on-board receiver of an aircraft carrying out landing maneuvers at an airport equipped with the MLS system receives signals during these maneuvers. These signals are put out by transmitters, the antenna of which are geographically distinct: the rear azimuth signals and the azimuth signals as such are transmitted by antenna which are at the end of the runway, respectively just before and after the landing strip, while the antenna transmitting the elevation angle and the flattening-out angle may be located laterally. The levels at which the signals are transmitted by these various antenna may vary greatly, and they are pulse-time multiplexed according to a format (TRSB) which is well defined for the MLS system. The resultant multiplexed signal reaches the input 1 of the on-board receiver of the said aircraft through an appropriate antenna (not depicted).

The input 1 of the receiver is linked by a filter 2 to a low noise, wide-band amplifier 3. The output of the amplifier 3 is linked by a second filter 4 to the input of an initial mixer 5 which also receives the initial signal OL1 of a local oscillator (not depicted) from a terminal 6.

The output of the mixer 5 is linked by a switchable attenuator 7 to an initial intermediate-frequency amplifier 8. Here the attenuator 7 comprises a PIN diode with an appropriate interface, the change-over time of this type of attenuator being less than one microsecond, the said interface comprising, for example, a switching transistor of the diode.

The output of the amplifier 8 is linked to an input of a second mixer which receives a second local oscillator signal OL2 from a terminal 10 at its other input. The output of the mixer 9 is linked to a second intermediate-frequency amplifier 11 comprising a filter 12 followed by an operational, logarithmic amplifier 13. The amplifier 11 has a high-frequency output 14 and a demodulated output 15. The output 15 is linked to the input 16 of a corrective network 17. In this network 17, the input 16 is linked firstly to an input of a comparator 18, receiving a threshold voltage, at its other input, which can be set from a terminal 19, and secondly an input from an adder 20. The output of the comparator 18 is linked to the input D of data from a D-type flip-flop circuit which receives at its clock pulse input H reference pulses, known as "Barker pulses", produced in a manner known per se and which are not depicted. The output Q of the flip-flop circuit 21 is linked to an input of an AND gate 22 which receives an angle enabling signal at its other output which is also produced in a way known per se by circuits that are not depicted. The output of the gate 22 is linked firstly to the input of the command 23 of the attenuator 7 and, secondly, to the input of the command 24 of a change-over switch which is preferably an electronic change-over switch. The change-over switch 25 comprises two electrodes or fixed contacts, one of which is linked to the frame (ground) and the other to a terminal 26 receiving a shifting voltage Vd. The output electrode, or removable contact, is linked to the other input of the adder 20, the output of which is linked to a terminal of the output 27.

The diagram of the FIG. 2 depicts various curves showing the variation in output voltage (voltage VS on outputs 15 or 27) demodulated (in V) according to the level of input voltage Ve (in dB) of the logarithmic amplifier 11. These various curves are respectively: at A, the curve obtained for an output voltage measured at the output 15 when the attenuator 7 is switched off; at B, the curve obtained for a voltage also measured at 15 but with the attenuator 7 switched off; and at C the curve obtained by an output voltage reading at 27 with the attenuator switched on. The curve A, which takes on a rectilinear form starting from an input voltage Ve2 (low threshold) presents a saturation level starting from an input voltage Ve2: the output voltage then becomes equal to Vsat, a saturation threshold which the device according to the invention has the task of pushing beyond the input voltage levels which might occur.

The curve B is identical at its start (low levels) with the curve A, and when the voltage Vs becomes equal to the threshold Vs1 determined by the voltage applied at 19, the input voltage being equal to Ve3, the output of the comparator 18 which, until then, has been equal to the logical level "0" immediately moves to logical level "1" and this level "1" is transmitted by the flip-flop circuit 21 and the gate 22 (it is assumed that the curves B and C of the FIG. 2, as regards each of their points and at least from the voltage Ve3 onwards, are obtained after the output signal of the comparator 18 has been taken into account by the flip-flop circuit 21, the gate 22 being on) at the command input 23 of the attenuator 7. Thus when the input voltage of the amplifier 11 reaches Ve3, its output voltage drops abruptly from Vs1 to Vsi-K.N, N being the attenuation (in dB) provided by the attenuator 7, and K the slope of the logarithmic amplifier (in V/dB). Beyond Ve3, the curve B is parallel to the curve A upto an input voltage Ve4 for which Vsat is reached at the output of the amplifier 11, Ve4 being greater than Ve2.

An amplifier showing a characteristic such as that illustrated by the curve V is unusable as such, for an output voltage Vss ranging from Vsi-K.N to Vsi corresponds to two different voltages Ve5 and Ve6, which are determined on the parts of the curve B before Ve3 and after Ve3 respectively. To remedy this, a voltage Vd is added to the output voltage of the amplifier 11 by means of the adder 20. This shifting voltage Vd is proportionate to the attenuation provided by the attenuator 7 and is sent to the adder 20 from the terminal 26 as soon as the threshold voltage Vsi is reached (the change-over switch 25, which is connected to the frame when the output voltage is below Vs1, flips over to Vd under the effect of the command signal at the output of the gate 22). The curve C thus obtained is substantially the same as the curve A upto the input voltage Ve2, but continues beyond this value along the extension of the rectilinear part from Ve1 to Ve2 upto an input voltage value Ve4. From this point onwards, the amplifier 11 is saturated. The saturation level corresponds to an output voltage V1sat such as V1sat−Vsat=K.N (in V). Thus the saturation level has been pushed further by a value proportionate to the attenuation provided by the attenuator 7. Of course, the value of N is determined so that the rectilinear part of the curve C is least as large as the maximum dynamic ratio of the signals that can be received.

It is also understood that if the amplifier 3 risks being saturated, it too can be preceded by another attenuator like the attenuator 7, this other attenuator being controlled by another corrective network such as the circuit 17 connected to the output 15 of the amplifier 11.

The timing diagram in FIG. 3 shows successively, from top to bottom, the reference pulses (Barker "pulses"), the signal Vs1 at the ouput 15 (in A this is the curve when the attenuator is switched off, for example by inhibiting the gate 22), the output signal D of the comparator 18, the output signal Q of the flip-flop circuit 21, the signal PA of the angle gate (the duration of which is the angle-measuring function of the MLS signal), the command signal CA of the attenuator 7 (the output signal of the gate 22) and the signal Vs2 at the output 27.

The start of the signal Vs1, before the angle data, comprises preliminary data transmitted in the present case at a level that is slightly superior to the threshold Vs1 (without reaching saturation), and this fact positions the output of the comparator 18 at "1". As soon as a Barker pulse arrives, the output of the flip-flop circuit 21 moves to "1" and remains there until the following Barker pulse. This preliminary signal is followed by an angle signal which characteristically comprises two similar sinusoidal portions. The signal obtained in 15 if the attenuator 7 is switched off is shown, for the timing diagram of Vs1, in A. A continuous line just below it shows the signal obtained with the attenuator switched on. This signal is shifted downwards, with respect to the signal in the curve A, by a value proportionate to the attenuation N(K.N). This shift takes place only during the presence of an active CA signal, that is, for the duration of the active signal PA. Thus a conventional-shaped angle signal is obtained at 27. If, as shown in the right-hand part of the FIG. 3, the following part of the signal Vs1 does not reach the threshold, the attenuator is not switched on at the following Barker pulse and the signal Vs1 is not modified. A signal Vs2, identical to this second part of Vs.1 is then obtained at 27.

The timing diagram of FIG. 4 shows the same succession of signals as in FIG. 3, with the FIG. 4 referring to the case where the input signal of the amplification chain is such that the signal Vs1 greatly exceeds the threshold Vs1. Thus, the angle signal A' (without attenuator) shows a high saturation of sinusoidal peaks and this fact is reflected in the signal D by pulses for the durations of the saturation phenomena. However, since the attenuator 7 is in operation, the signal E really obtained at 15 does not present these phenomena of saturation. The signal Vs2 thus has a normal shape, without deformation (identified in F).

The FIG. 5 shows an example of the embodiment of the circuit 7. The command terminal 23 is series-connected by a Zener diode, which has a Zener voltage of 6.2 V for example, with a resistor 31 to the base of a transistor 32. The common point of the diode 30 and the resistor 31 is connected by a resistor 33 to the emitter of the transmitter 32. The emitter of the transmitter 32 is connected by an inductor 34 to the negative pole of a voltage source of 6V for example. This emitter is also connected by a capacitor 35 to the frame.

The collector of the transistor 32 is series-connected by a resistor 36, with an inductor, to the positive pole of a voltage source of 5V for example. The common point of the resistor 36 and the inductor 37 is connected to the frame by a capacitor 38.

The input terminal 39 of the circuit 7 (connected externally to the output of the mixer 5) series-connected by a capacitor 40, with an inductor 41, to the collector of the transistor 32. The common point of the capacitor 40 and the inductor 41 is connected by a diode 42, in series with a capacitor 43, to the base of the output 44 of the circuit 7 (connected externally with the input of the amplifier 8). The common point of the cathode of the diode 42 and the capacitor 43 is connected to the frame by a capacitor 45.

We claim:

1. A device to increase the dynamic ratio of an amplifier comprising:
    a switchable attenuator coupled to the output of said amplifier;
    switching means coupled to the switching input of said attenuator and said amplifier for turning on said attenuator when the signal inputted to said amplifier exceeds a predetermined value; and
    a corrective network also coupled to the output of said amplifier and to said switching means such that said corrective network during the time that said switchable attenuator is turned on adds to the output of said amplifier a variable voltage, whose absolute value is equal to the product of the slope of said amplifier and the attenuation of said switched attenuator.

2. A device as in claim 1 wherein said amplifier is part of an on-board MLS receiver.

3. Device according to the claim 1 wherein the attenuator is of the PIN diode type.

4. Device according to claim 2 wherein said corrective network comprises:
    a comparator having one input linked to a demodulated output of the amplifier circuit and having a second input linked to a threshold voltage source, wherein the output of this compartor is linked to the input of the attenuator and to a change-over switch which is linked on the input side, on the one hand, to a zero voltage source and, on the other hand, to a shifting voltage source, and wherein the output of said change-over switch is linked to one input of an adder, with the other input of said adder being linked to the said demodulated output.

5. Device, according to the claim 4, for an on-board MLS receiver wherein, in the corrective network, the output of the comparator is linked to the data input of a D type flip-flop circuit, the clock pulses input of which receives Barker pulses, the output of this flip-flop circuit being linked to the input of an AND gate, the other input of which receives an angle enabling signal, the output of this gate being linked to the command input of the said change-over switch and that of the attenuator.

* * * * *